US 6,671,785 B2

(12) United States Patent
Dalvi et al.

(10) Patent No.: US 6,671,785 B2
(45) Date of Patent: Dec. 30, 2003

(54) PROGRAMMING PROTECTION STATUS INDICATORS FOR FLASH MEMORY

(75) Inventors: Vishram P. Dalvi, Folsom, CA (US); Rodney R. Rozman, Placerville, CA (US)

(73) Assignee: Intel Corporation, Santa Clara, CA (US)

(*) Notice: Subject to any disclaimer, the term of this patent is extended or adjusted under 35 U.S.C. 154(b) by 51 days.

(21) Appl. No.: 09/557,184

(22) Filed: Apr. 21, 2000

(65) Prior Publication Data

US 2002/0095545 A1 Jul. 18, 2002

Related U.S. Application Data

(62) Division of application No. 08/814,928, filed on Feb. 27, 1997.

(51) Int. Cl.[7] .................................................. G06F 1/00
(52) U.S. Cl. ...................................... 711/154; 711/103
(58) Field of Search ................................. 711/154, 103

(56) References Cited

U.S. PATENT DOCUMENTS

| 5,355,464 A | | 10/1994 | Fandrich et al. | |
| 5,513,136 A | * | 4/1996 | Fandrich et al. | ....... 365/185.04 |
| 5,559,988 A | | 9/1996 | Durante et al. | |
| 5,561,628 A | | 10/1996 | Terada et al. | |
| 5,592,641 A | * | 1/1997 | Fandrich et al. | ............ 711/103 |
| 5,749,088 A | * | 5/1998 | Brown et al. | ............... 711/115 |
| 5,937,424 A | | 8/1999 | Leak et al. | |
| 5,954,818 A | * | 9/1999 | Dalvi et al. | ................. 713/200 |

OTHER PUBLICATIONS

IEEE Press, IEEE 100: the authoritative dictionary of IEEE standard terms, 7th ed., entry for "state machine", Dec. 2000, p. 1102.
S. Savitzky, Real–Time Microprocessor Systems, 1985, pp. 239–247.

* cited by examiner

Primary Examiner—David L. Robertson
(74) Attorney, Agent, or Firm—Blakely, Sokoloff, Taylor & Zafman LLP

(57) ABSTRACT

A status register for a memory device. The status register provides a programming suspend status signal and a protection status signal. The programming suspend status signal indicates whether a programming operation is suspended. If the processor knows that a programming operation to a specific memory location is suspended, then the processor may request that a data modification operation to another memory location be performed while the programming operation is suspended. The protection status signal indicates whether an attempted data modification operation failed due to a protected memory block versus another type of device failure. Protecting or locking a memory block prevents the modification of data stored in a particular memory block.

8 Claims, 17 Drawing Sheets

FIG. 1
(PRIOR ART)

| 105 WSMS | 104 ESS | 103 ECLBS | 102 BWSLBS | 101 VPPS |

| 408 | 407 | 406 | 405 | 404 | 403 | 402 | 401 |
|---|---|---|---|---|---|---|---|
| WSMS | ESS | ECLBS | BWSLBS | VPPS | BWSS | DPS | R |

400

PROGRAMMING PROTECTION STATUS INDICATORS FOR FLASH MEMORY

The present application is a divisional application of U.S. patent application Ser. No. 08/814,928 filed Feb. 27, 1997 and thus claims priority from said application.

FIELD OF THE INVENTION

BACKGROUND OF THE INVENTION

Status registers are often used to store status information relating to the internal operations of a semiconductor integrated circuit ("IC"). Memory ICs or devices, such as flash electrically erasable programmable read only memory ("EEPROM") devices, may store information in a status register to indicate whether an operation (e.g., an erase operation, a programming operation, a read operation, etc.) is in progress or is completed. The status register may also indicate whether a specific operation has been completed successfully or unsuccessfully. Such information often provides necessary or desirable information to other components in a system.

For example, the processor or CPU in a system may need to know when an erase operation performed on a memory device (such as a flash memory device) is completed before requesting the memory device to perform a programming operation. Additionally, the processor in a system may want to know whether an erase operation to a specific memory location has been suspended. Typically, an erase operation takes a much longer time to complete as compared to a programming or read operation. For example, an erase operation may take a few milliseconds ("ms"), whereas a programming operation may take 7-8 microseconds ("$\mu s$") and a reading operation may take 85 nanoseconds ("ns"). Thus, when an erase operation to a specific memory location is suspended, the processor may program or read data from a different memory location rather than waiting for the completion of the current erase operation. The ability to suspend an erase operation may improve the overall performance of a flash memory device.

Typically, a status register stores multiple memory bits in which one or more of the memory bits may be used to provide a specific status signal. The status signal may be sent as an output from the memory device via a designated output pin when polled or via the data input/output ("I/O") pins of a memory device in response to a read status register command.

FIG. 1 illustrates one embodiment of a status register for a prior art flash memory device that is capable of performing programming, erase, and read operations. The status register 100 includes the five memory locations 101 through 105 with each memory location storing at least one memory bit. For the embodiment shown in FIG. 1, the status register 100 provides five status signals. The memory location 101 stores Vpp status ("VPPS") information; the memory location 102 stores byte write and set lock bit status ("BWSLBS") information; the memory location 103 stores erase and clear lock bits status ("ECLBS") information; the memory location 104 stores erase suspend status ("ESS") information; and the memory location 105 stores write state machine status ("WSMS") information.

The VPPS information indicates whether Vpp, the programming voltage, is at an acceptable voltage level or not at an acceptable voltage level. If Vpp is not at an acceptable voltage level, then the current operation may be aborted. The BWSLBS information indicates an unsuccessful byte write operation or a successful byte write operation. Alternatively, the BWSLBS information indicates an unsuccessful set master/block lock bit operation or a successful set master/block lock bit operation. The ECLBS information indicates an unsuccessful block erasure operation or a successful block erasure operation. Alternatively, the ECLBS information indicates an unsuccessful clear lock bits operation or a successful clear lock bits operation. The ESS information indicates that the block erase operation is suspended or that the block erase operation is in progress/completed. The WSMS information indicates that the write state machine is ready or is busy.

The VPPS signal, the BWSLBS signal, the ECLBS signal, the ESS signal, and the WSMS signal are provided are outputted in response to a read status register command. Furthermore, the WSMS signal is outputted by polling a dedicated status output pin (e.g., pin).

The prior art memory device described above did not, however, provide the feature of suspending a programming operation. Therefore, a programming operation specifying a particular memory location could not be suspended in order to perform another operation, such as a read operation to another memory location, while the programming operation is suspended. In certain situations, it may be more efficient to perform a read operation (which requires less time than a write operation) while a programming operation is suspended, rather than waiting until the programming operation is completed.

Additionally, the prior art memory device described above did not provide the feature of indicating whether an unsuccessful program or erase operation was due to an attempt to access data in a protected memory block. A prior art protection mechanism was implemented by the setting and clearing of memory bits (i.e., lock bits) that correspond to the various memory blocks in the memory device. The lock bits are stored in a miniature array referred to as the block lock mini-array. The lock bits within the block lock mini-array are set to indicate that the corresponding memory block is locked, and cleared (or not set) to indicate that the corresponding memory block is unlocked. A read, program, or erase operation may be performed on any unlocked memory block. A program or erase operation may not, however, be performed on any locked memory block unless an override lock operation is first performed on the locked memory block.

SUMMARY OF THE INVENTION

A memory device is described that has a control circuit coupled to a memory array and a register. The register is configured to store at least one bit indicating the suspend status of a write operation. The control circuit is configured to update the register and to control the output of a status signal representing the suspend status of the write operation.

A memory device is described that has a control circuit coupled to a memory array and a register. The register is configured to store at least one bit indicating the protection status of a data modification operation. The control circuit is configured to update the register and to control the output of a status signal representing the protection status of the data modification operation.

A method is also described for providing the suspend status of a programming operation in a memory device. A programming operation to a memory location is performed. Prior to the completion of the programming operation, a suspend status signal is received. It is determined whether or not to suspend the programming operation. If the programming operation is suspended, a status register is updated, if necessary, to indicate the programming operation is suspended. An output signal is provided to indicate the suspend status of the programming operation.

A method is also described for providing the protection status of a data modification operation in a memory device. A data modification operation is issued with respect to a memory location. The protection status of the memory location is determined. An output signal is provided to indicate the protection status of the memory location.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 illustrates a prior art status register.

FIG. 4 illustrates one embodiment of the status register.

DETAILED DESCRIPTION

Figure 2:
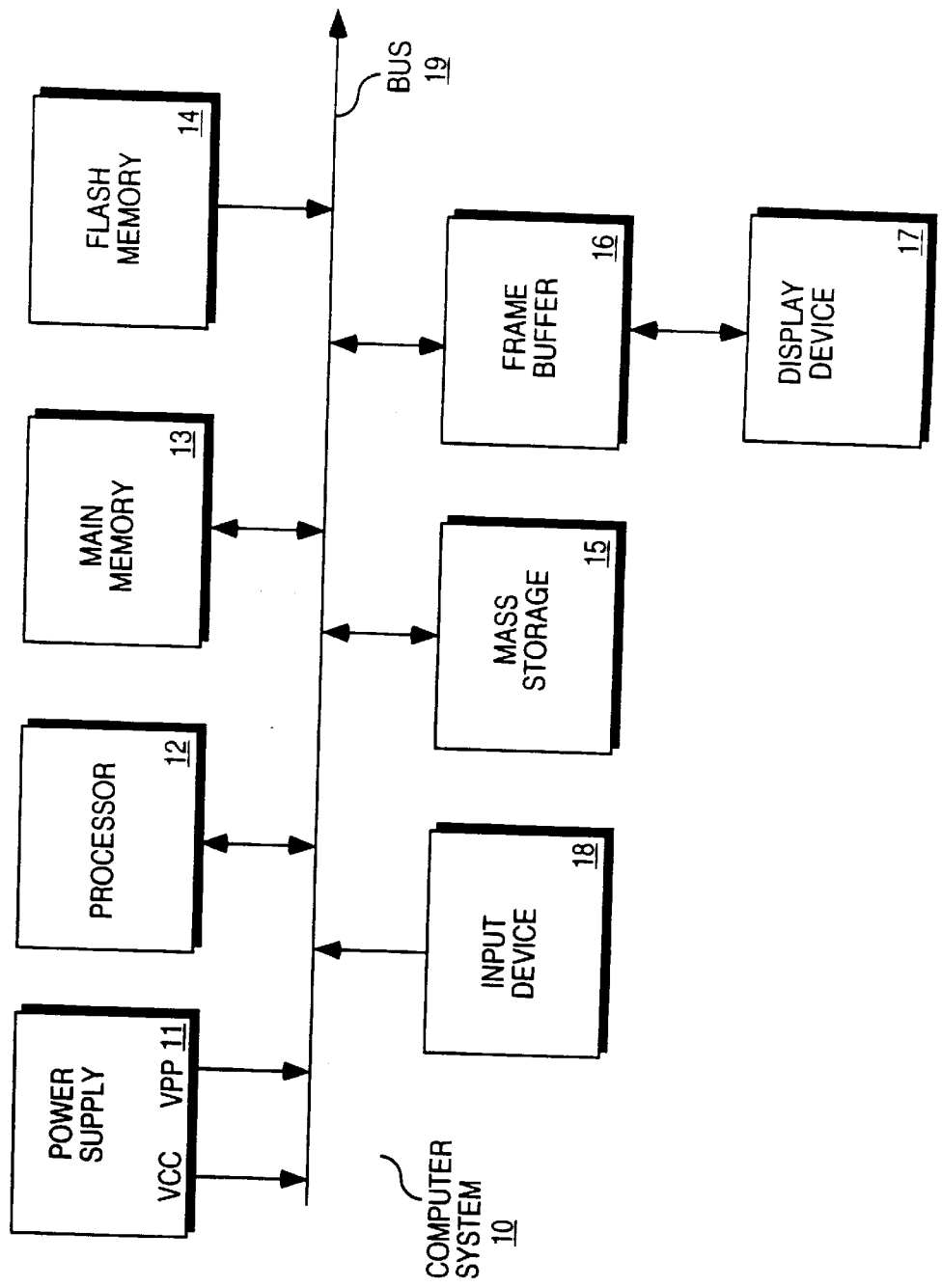
FIG. 2 illustrates a computer system that includes one embodiment of the memory device.

One embodiment of the memory device optimizes the memory to processor interface by providing a programming suspend status signal. The programming suspend status signal is used to indicate the current execution status (i.e., whether a programming operation is suspended or is not suspended) of a programming operation. For one embodiment, the programming operation is a byte write operation. Once the processor is informed that the execution of the current programming operation is suspended, the processor may request that a different read, program or erase operation may be performed while the programming operation is suspended.

For example, once the processor is informed that the programming operation to a specific memory location is suspended, then the processor may request that a read operation be performed on another memory location. As such, the processor may not be required to wait until the entire programming operation to a first memory location is completed (which may be an unacceptable time) before reading from a second memory location. In certain situations, this feature may improve the efficiency of the computer system.

One embodiment of the memory device optimizes the memory to processor interface by providing a protection status signal. This signal is used to indicate whether the memory location accessed by a program or erase operation resides in a protected memory block or an unprotected memory block.

For one embodiment, a protected memory block is referred to as a locked memory block and an unprotected memory block is referred to as an unlocked memory block. The data stored in an unlocked memory block may be modified by a program or erase operation; however, the data stored in a locked memory block may not be modified unless the memory block is first unlocked by an override operation. This feature of providing a protection status signal typically allows the processor to differentiate between a program or erase operation that failed due to an attempt to access a memory location in a memory block that was protected (e.g., block locked) versus a program or erase operation that failed due to a power failure or a bad block. One intent is to improve the efficiency of the computer system.

The purpose of the protection status signal is to provide the user with meaningful information about an operation. If the user finds out that the operation (for example, a byte write operation) failed because of block protection, the user can unlock the block and reissue the command. But if the operation failed because of a bad block, then the user will not try to write again to the same location. That is why the differentiation between the two types of failures is advantageous. An analogy would be being unable to open a car door because the door is locked versus because the door is jammed. In the former case, one uses a key to open the door. In the latter case, one calls a mechanic to fix the door.

One embodiment of the memory device may be used in various types of computer systems or data processing systems. The computer system within which the memory device, such as a flash memory device, is used can be a personal computer, a notebook computer, a laptop computer, a personal assistant/communicator, a minicomputer, a workstation, a mainframe, a multiprocessor computer, or any other type of computer system. In addition, the system in which the memory device is used can be a printer system, a cellular phone system, a digital answering system, a digital camera, or any other system that requires data storage.

FIG. 2 illustrates one embodiment of a general purpose computer system 10. The computer system 10 may include a power supply 11, a central processing unit ("CPU") 12, a main memory 13, a flash memory 14, a mass storage device 15, a frame buffer 16, and an input device 18, all of which are coupled to a bus 19. Data may be transferred among the various components in the system 10 via the bus 19. The frame buffer 16 receives image data which are displayed on the display device 17.

For one embodiment, the mass storage device 15 is a "solid state disk drive" that includes a plurality of flash EEPROM devices for emulating the operation of a magnetic hard disk drive. For another embodiment, the mass storage device 15 is a hard disk drive.

The power supply 11 includes a VCC output that provides the VCC operating voltage to the various components in the system via the bus 19. The power supply 11 may also include a VPP output that provides the VPP programming voltage to flash memory 14 and flash memory within mass storage device 15.

Figure 3:
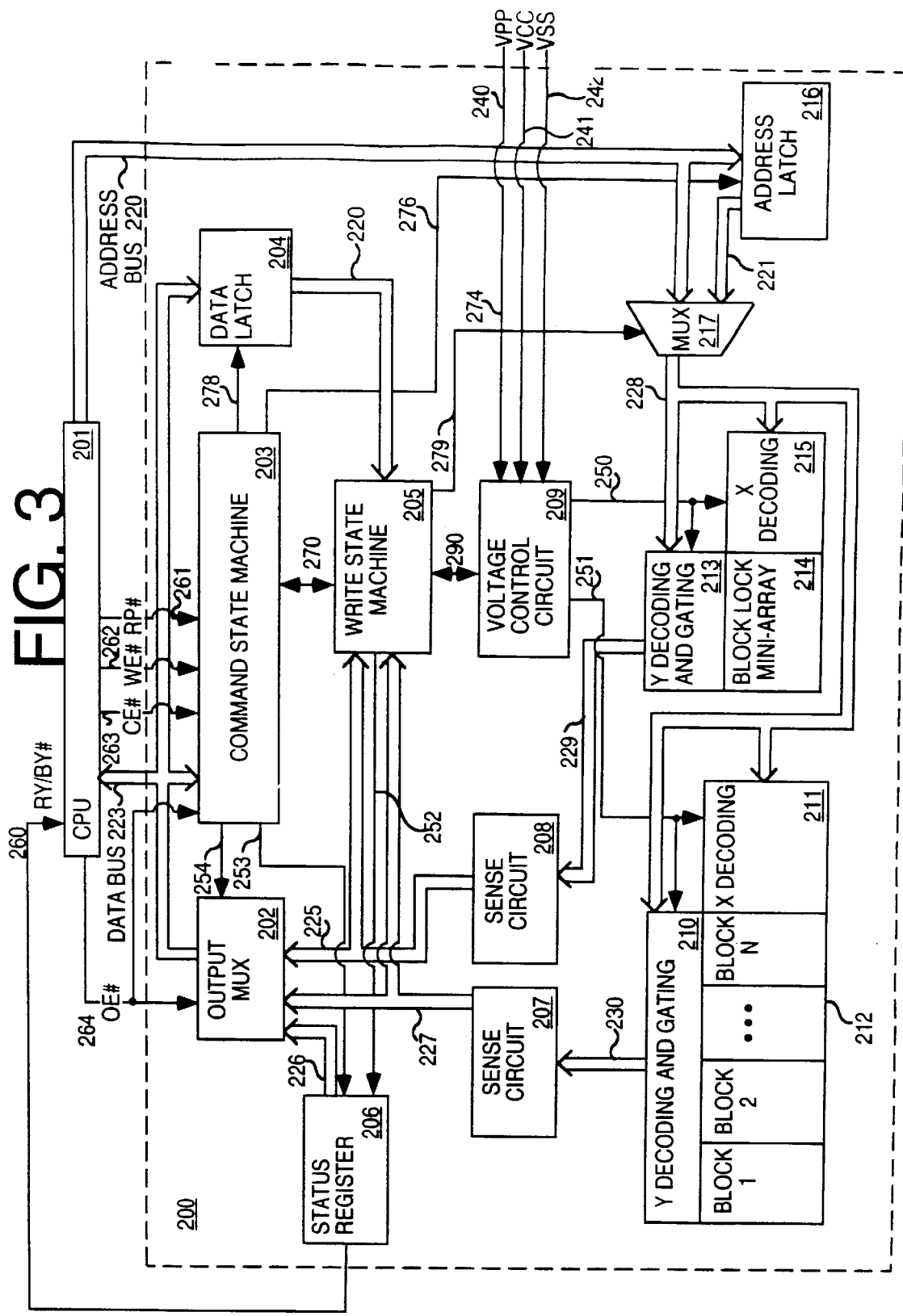
FIG. 3 illustrates a CPU coupled to one embodiment of the memory device.

FIG. 3 illustrates one embodiment of a block diagram of a flash memory device 200 coupled to a CPU 201 in a computer system. The flash device 200 includes a main memory array 212, which is subdivided into multiple memory blocks (i.e., block 1 through block N). For one embodiment, the main memory 212 stores 1 megabyte of data with each byte storing 8 bits of data. The 1 megabyte of data may be arranged in sixteen 64 kilobyte memory blocks which are individually erasable, lockable, and unlockable in the computer system. The Y decoding and gating circuit 210 and the X decoding circuit 211 may be used to select the memory locations within the main memory array 212 that are accessed by the CPU 201.

For one embodiment, main memory 212 includes flash memory cells that include electrically isolated gates referred to as floating gates. The flash memory cells include a drain region and a source region in a substrate. A polysilicon gate is generally disposed above and between these regions and insulated from these regions by an insulating layer. A second gate, referred to as the control gate, is disposed above the floating gate and may be fabricated from a second layer of polysilicon. The gate terminals of the flash memory cells are coupled to the word-lines and the drain terminals of the flash memory cells are coupled to the bit-lines.

The flash memory device 200 includes a block lock mini-array 214 for storing bits referred to as the block lock bits. As noted above, the setting and clearing of the block lock bits is used to prevent or protect data stored in the main memory array 212 from being modified. The Y decoding and gating circuit 213 and the X decoding circuit 215 is used to select the memory locations within the block lock mini-array 214 that are accessed by the CPU 201.

For one embodiment, the protection mechanism incorporating the block lock bits uses a combination of bits, sixteen block lock bits and a master lock bit, to lock and unlock the various memory blocks. The locked block lock bit frustrates attempts to perform block erase or programming operations, while a locked master lock bit frustrates attempts to modify the block lock bits. Various lock bit configuration operations (i.e., set block lock bit, set master lock bit, and clear block lock bits commands) are used to configure the bits in the block lock mini-array. For an alternative embodiment, the mini-array 214 is used to store data other than the block lock bits.

When the CPU 201 accesses a memory location for an operation (e.g., read operation, write operation, erase operation, etc.), the address signals generated by the CPU 201 are received by the flash memory device 200 via the address bus 220. The address signals are inputted directly into the multiplexer ("mux") 217 or inputted into the address latch 216. The address latch 216 is coupled to the mux 217 to provide address signals to the mux 217 via the internal bus 221. The command state machine ("CSM") 203 provides a control signal to the mux 217 to select between the input coupled to the address bus 220 and the input coupled to the address latch 216. The mux 217 provides the address signals generated by the CPU 201 over the internal bus 228 to the appropriate decoding circuits (i.e., Y decoding and gating circuit 213, X decoding circuit, Y decoding and gating circuit 210, and X decoding circuit 211).

The CSM 203, also referred to as the command user interface ("CUI"), serves as the interface between the CPU 201 and the internal operation of the flash memory device 200. Commands are written into the CSM 203 using standard microprocessor write timings. The CSM 203 contents serve as an input to the internal write state machine ("WSM") 205, which controls the various data modification operations of the flash memory device 200. For one embodiment, the CSM 203 controls the block erase, byte write, and lock bit configuration operations. Functions associated with altering the data in the memory arrays (e.g., block erase, byte write, lock bit configuration, and status operations) are accessed via the CSM 203 and are executed under the control of the WSM 205. Data stored in the memory arrays 212 and 214 or data stored in the status register 206 may be accessed by inputting the appropriate commands into the CSM 203. WSM 205 is coupled to the status register 206 via line 252. The CSM 203 and the WSM 205 are referred to as the control logic.

Once a valid command or command sequence has been generated by the CPU 201 and written into the CSM 203, the flash memory device 200 automatically executes the command or commands. In other words, the control logic automatically executes the algorithms and timings necessary for the various data operations.

The CPU 201 programs (i.e., writes) data into the flash memory device 200 via the data bus 223. Data bus 223 is coupled to the data input/output pins (e.g., $DQ_0$–$DQ_7$). The data to be written into the main memory array 212 or the block lock mini-array 214 is inputted into the data latch 204 via the data bus 223 when the appropriate control signals (e.g., $\overline{WE}$) are received from the CPU 201, and subsequently inputted into the write state machine 205 via the internal bus 220. When the CSM 203 provides the control signals to the WSM 205 via the line 270, the WSM 205 provides the appropriate program control signals over line 290 to the voltage control circuit 209. In response to the program control signals from the WSM 205, the voltage control circuit 209 provides the appropriate voltage signals to the flash memory cells selected (i.e., addressed) for programming. For one embodiment, flash memory cells may be programmed by applying 12 volts to the gate terminal of the flash memory cell via the selected word-lines, 6 volts to 7 volts to the drain terminal of the flash memory cell via the selected bit-lines, and by applying ground to the source terminal of the flash memory cell.

For one embodiment, the data operations of writing or programming data into the memory arrays are performed in byte increments and thus are referred to as byte write operations. For one embodiment, a byte write operation takes approximately 6 $\mu$s when Vcc is at 5 volts and Vpp is at 12.0 volts. One embodiment of the flash memory device 200 may also operate in the byte write suspend mode. The byte write suspend mode enables the system to read data or execute code from any other memory location within the flash memory array while the byte write operation is suspended.

Data stored in the memory arrays (e.g., main memory array 212, block lock mini-array 214) may be erased by applying the appropriate voltage signals to the selected memory cells. During an erase operation, the CSM 203 receives an erase command via the data bus 223 and the CE# and WE# control signals from the CPU 201. Once the CSM 203 provides erase control signals to the WSM 205, the WSM 205 may enable the voltage control circuit 209 to provide the appropriate voltage signals to the selected memory cells. For one embodiment, a block of memory cells may be erased by applying −11 volts to gate terminal of the flash memory cells, 6 volts to the source terminal of the flash memory cells, and by floating the drain terminal. For one embodiment, an entire block may be erased within 1 second.

The CPU 201 reads data stored in the memory arrays (e.g., main memory array 212, block lock mini-array 214) via the data bus 223. The main memory array 212 is coupled to the sense circuit 207 via the bus 230, and the block lock mini-array is coupled to the sense circuit 208 via the bus 229. The sense circuit 207 is used to sense the bit-line voltages of memory cells in the main memory array 212. Similarly, the sense circuit 208 is used to sense the bit-line voltages of memory cells in the block lock mini-array 214. The sense circuit 207 provides data signals over the bus 227 to the output multiplexer ("mux") 202 and the sense circuit 208 provides data signals over bus 225 to the output mux 202. These data signals represent the data read from the selected memory locations. For one embodiment, each memory location accessed for a read operation includes eight bits. When the output mux receives the appropriate read control signals via line 254 from the OSM 203 and receives an asserted output enable ("OE") signal from the CPU via line 264, the output mux 202 outputs the data signals onto the data bus 223. The CPU 201 then accesses the data from the data bus 223.

The flash memory device 200 also includes a status register 206. The status register 206 includes any type of storage device that is capable of storing the status information. For one embodiment, the status register 206 includes multiple flip-flop circuits. Although FIG. 3 shows the status register 206 residing outside of CSM 203, for an alternative embodiment, status register 206 resides within the CSM 203 or the control logic.

Status register 206 indicates when the WSM 205 has completed a block erase, byte write, or block lock bit configuration operation. Furthermore, the status register 206 indicates whether these operations have been completed successfully or unsuccessfully. Status register 206 also provides other status signals, such as a byte write suspend status signal that indicates whether a byte write operation has been suspended or a protection status signal to indicate whether a byte write operation, a block erase operation, or a block lock bit configuration operation has failed due to attempts to modify a "locked" memory location.

The CPU 201 accesses the data stored in the status register 206 by providing a read status register command over the data bus 223. In response to a read status register command, the CSM 203 provides a read status register control signal over line 253 to the status register 206. The requested status data from the status register 206 is outputted onto the internal bus 226. When the control signals generated by the CSM 203 and received by the output mux 202 over line 254 enables the output mux 202 to select the data from the internal bus 226, the requested status data is then outputted from the flash memory device 200 via the data bus 223.

The status register 206 stores multiple memory bits, and one or more of the memory bits is used to provide a specific status signal. The status signal is outputted from the flash memory 200 via an output pin designated to provide a certain status signal or via the data input/output pins (e.g., DQ0–DQ7). For one embodiment, the flash memory device 200 includes a READY/BUSY# (RY/BY#) pin to indicate whether the flash memory device is ready to receive a new command or is busy performing the previous command. The processor polls the RY/BY# pin to determine the status of the RY/BY# pin. For an alternative embodiment, the status of a specific status signal is read via the data input/output pins (e.g., DQ0–DQ7) of the flash memory device 200 after inputting a read status register command via the data input/output pins.

FIG. 4 illustrates one embodiment of the status register 206. The status register 400 includes eight memory locations 401 through 408. Each of the memory locations stores at least one memory bit and provides at least one status signal. Similar to the prior art status register 100, the status register 400 stores the Vpp status ("VPPS") information, the byte write and set lock bit status ("BWSLBS") information, the erase and clear lock bits status ("ECLBS") information, the erase suspend status ("ESS") information, and the write state machine status ("WSMS") information. More specifically, memory location 404 stores the VPPS information. Memory location 405 stores the BWSLBS information. Memory location 406 stores the ECLBS information. Memory location 407 stores the ESS information. Memory location 408 stores the WSMS information.

In addition to storing the status information for the VPP, BWSLBS, ECLB, ES, and WSM, the status register 400 includes additional memory locations for storing the status information related to the suspension of a programming operation and/or the protection of a memory location (or locations) addressed for a data operation. For one embodiment, the status register stores write byte suspend status ("WBSS") information and/or the data protection status ("DPS") information. The number of total memory locations may vary for alternative embodiments. Furthermore, the status register 400 may include one or more additional memory locations, such as the memory location 401, which is designated as a reserved memory location. A reserved memory location is a memory location that is not currently being used to store status information but may be reserved to store status information in the future.

One embodiment of the flash memory device 200 allows the system software to suspend a programming operation in order to read data from another flash memory array location. A programming operation is suspended by entering a programming suspend command. For one embodiment, a programming operation is referred to as a byte write operation. The programming operation is suspended by entering a byte write suspend command. Once the programming process starts, a programming suspend command causes the control logic to suspend the byte write sequence at one of the predetermined points in the algorithm. The BWSS information indicates whether the programming operation is suspended or not suspended in response to the programming suspend command.

One embodiment of the flash memory device 200 stores DPS information. When a data modification operation (i.e., a program or erase operation) is requested, a protect status signal is outputted from the flash memory device 200 to inform the CPU (or other devices) that the attempted data modification operation addressed a protected memory location (e.g., a locked memory location) or an unprotected memory location (e.g., an unlocked memory location). For one embodiment, when the requested data modification operation fails, the user is able to distinguish between an operation failure due to locked memory block versus an operation failure due to other failures, such as power failure or a bad block. This allows the user to be better informed as to the causes of the failure so the user can better react to the failure.

For example, if the requested data modification operation failed due to an attempt to modify data in a locked memory block, the user may the decide to modify data in another memory block that is unlocked or the user may decide to unlock the memory block in order to modify the data. On the other hand, if the requested data modification operation failed due to a bad block, the bad block may be replaced with a redundant block or the flash memory device 200 may be designated as a failed device.

Figure 5:
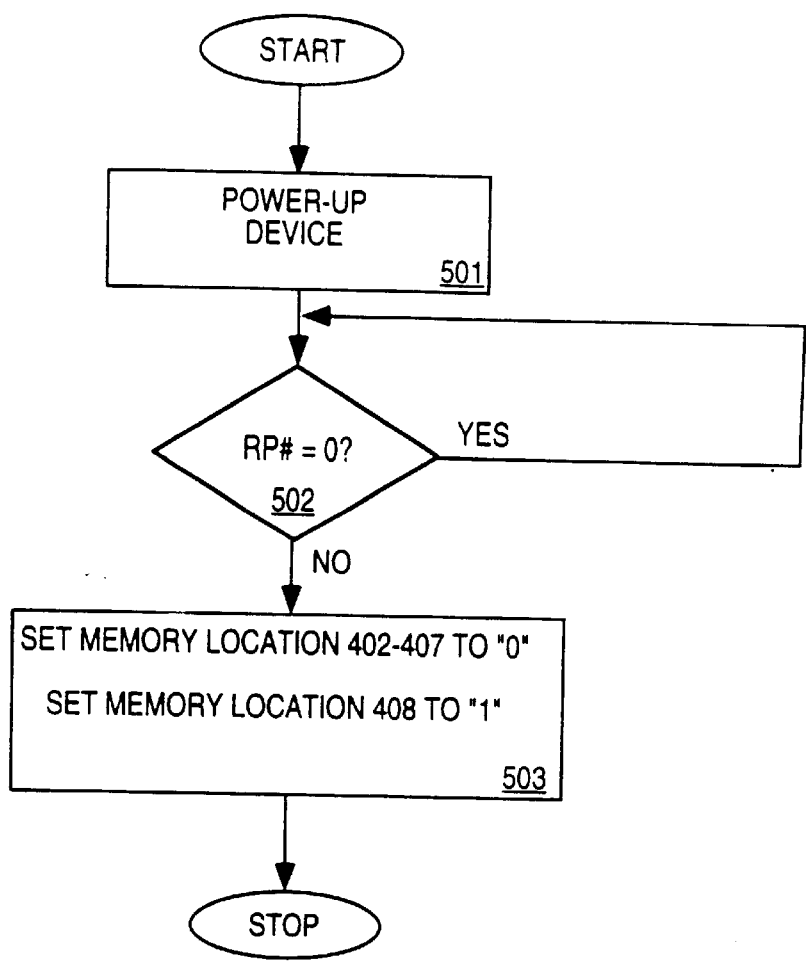
FIG. 5 illustrates a flow chart for initializing one embodiment of the status register.

The following figures illustrate the steps involved in providing the various status signals. For one embodiment, the status register 400 is initialized according to the steps shown in FIG. 5. The flash memory device 200 is powered-up by applying the appropriate power supply signals as shown in step 501. For one embodiment, the flash memory device 200 operates with a 3.3 volt or a 5.0 volt VCC power supply. For an alternative embodiment, the flash memory device operates with a 1.8 volt VCC power supply.

Once the flash memory device 200 is powered-up, the RESET/DEEP POWER-DOWN (RP#) input pin is checked, as shown in step 502. For one embodiment, the RP# pin is used for placing the flash memory device 200 in the deep power-down mode and for resetting the internal automation of the flash memory device 200. A logic high voltage level on RP# enables the normal operation of the flash memory device 200 and a logic low voltage level on RP# inhibits any operations in order to provide data protection during power transitions and to save power. If RP# is at a logical high level, then the memory locations 402 through 408 are initialized as shown in step 503. For one embodiment, the memory locations 402 through 407 are initialized by being set to "0" and the memory location 408 is initialized by being set to "1."

When the status register 400 is initialized, the memory location 402 indicates an unlocked protection status. Memory location 403 indicates a byte write operation is in progress or completed. Memory location 404 indicates that the Vpp voltage is at an appropriate voltage level. Memory location 405 indicates a successful byte write operation or set master/block lock bit operation. Memory location 406 indicates a successful block erase operation or clear lock bits operation. Memory location 407 indicates a block erase operation is in progress or is completed. Memory location 408 indicates that the control logic is ready to receive a new command or command sequence.

Figure 6:
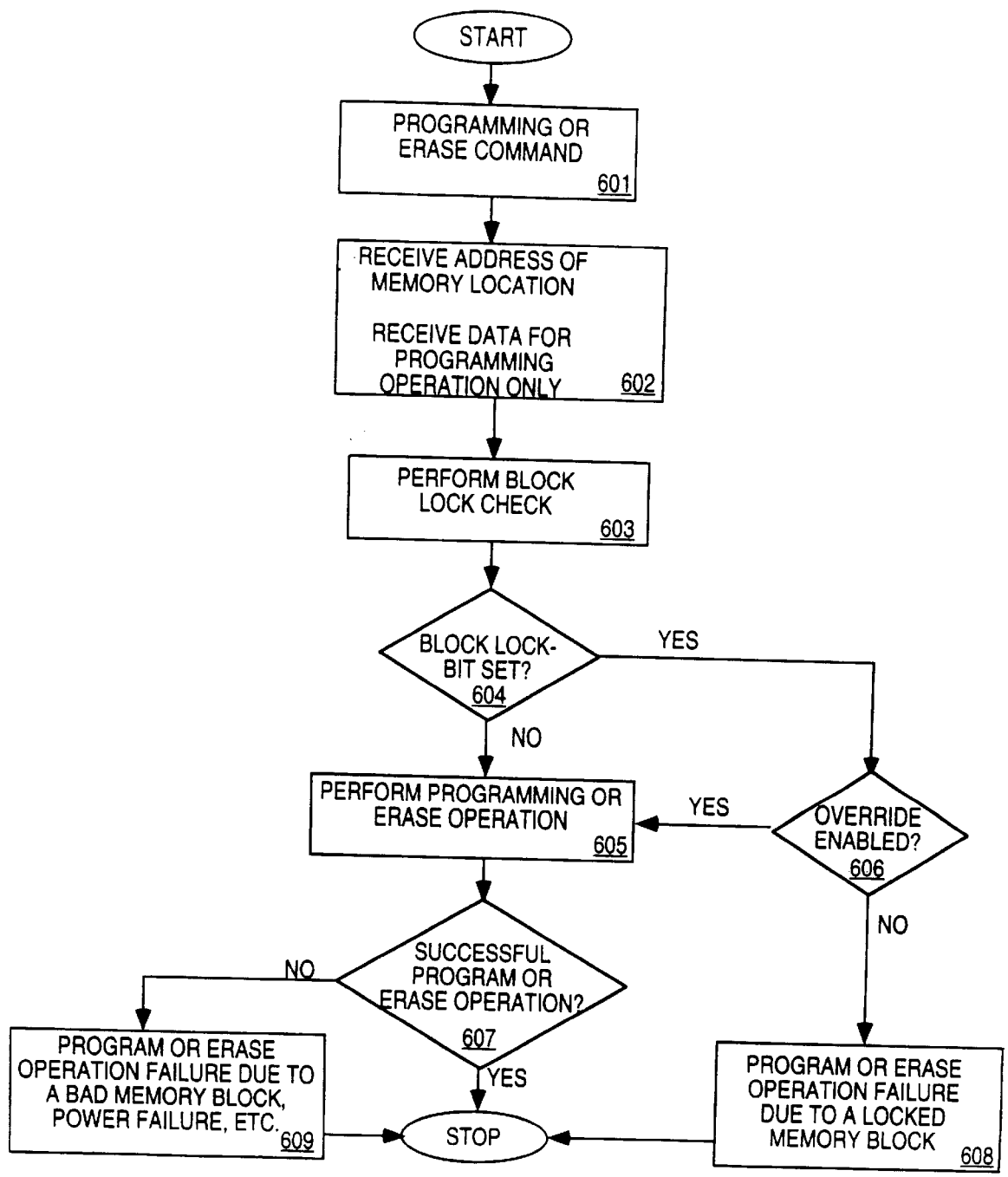
FIG. 6 illustrates a flow chart for performing a programming or erase operation for one embodiment of the memory device.

FIG. 6 illustrates a flow chart for performing a programming or erase operation for one embodiment of the flash memory device 200. According to step 601, a programming command or an erase command is received by the flash memory device 200. The programming command or the erase command may include a sequence of commands. Typically, these commands are generated by the CPU 201.

If a programming command (or sequence of commands) is received, the address of the memory location to be written to and the data to be written is received by the flash memory device 200, as shown in step 602. If an erase command is received, the address of the memory location (i.e., memory block) to be erased is received by the flash memory device 200, as shown in step 602. After steps 601 and 602 are completed, the control logic controls the programming and programming verify algorithms internally (not shown). Similarly, the control logic controls the erase and erase verify algorithms internally (not shown).

The flash memory device 200 then performs a block lock check in step 603. The block lock check includes a sequence of steps that update the status register (e.g., the memory location 402, which stores the protection status information). The block lock check is described in more detail in connection with FIG. 7.

Next, the control logic determines whether the block lock bit, corresponding to the memory location to be accessed, is set. If the block lock bit is not set, then the programming or erase operation is performed in step 605 and the programming or erase operation is verified in step 607. On the other hand, if the block lock bit is set, then the flash memory device 200 determines whether or not to override the setting of the block lock bit corresponding to the memory location addressed for a write or erase operation, as shown in step 606. For one embodiment, the override command may be enabled by RP# being at 12 volts. If the override is not enabled and the block lock bit is set, then the programming or erase operation fails due to a locked memory block.

On the other hand, if the override is enabled and the set block lock bit is cleared, then the programming or erase operation is performed at step 605 and then verified as having been successfully performed in step 607. If it is determined in step 607 that the programming or erase operation was not successful, then the flash memory device 200 indicates that the programming or erase operation failed for reasons other than an attempt to access a memory location residing within a locked memory block, as shown in step 609. For example, the failure may have been caused by a performing an erase or programming operation on a bad or defective memory block or a power failure. Otherwise, the flash memory device 200 indicates that the programming or erase operation was successfully completed.

Figure 7:
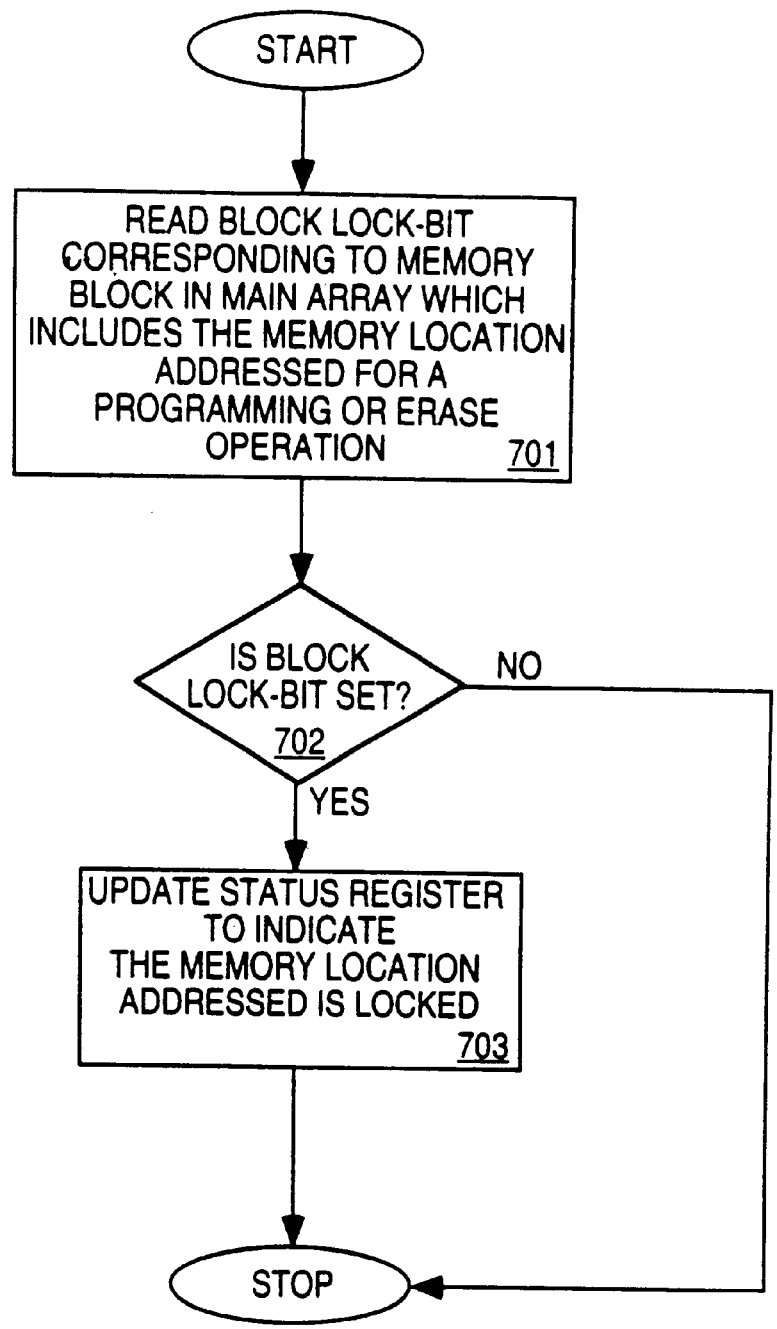
FIG. 7 illustrates a flow chart for performing a block lock check for one embodiment of the memory device.
Figure 8:
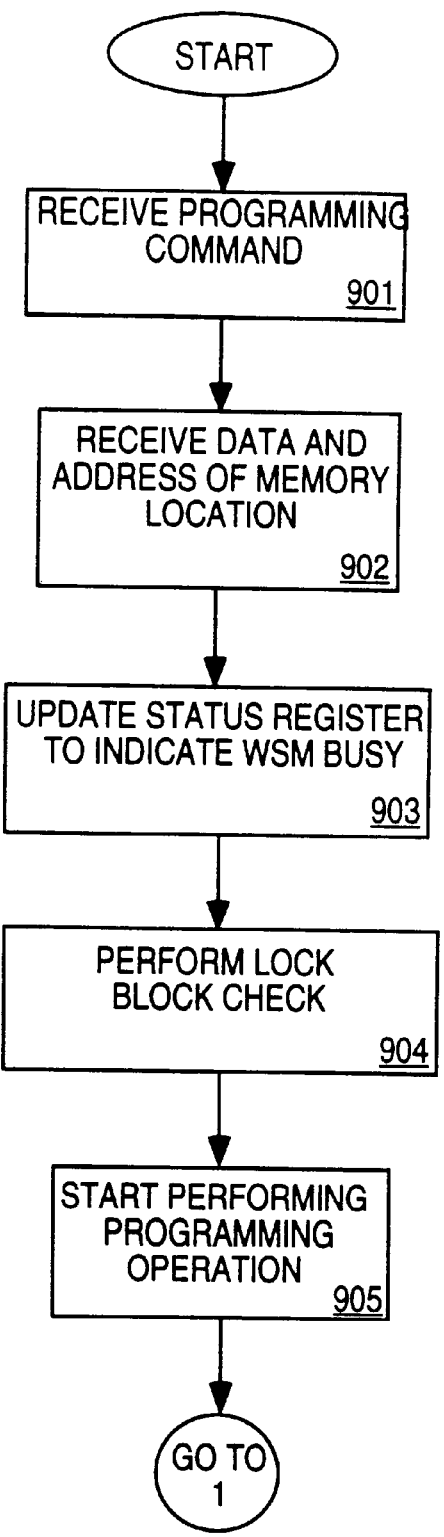
FIGS. 8 through 12 illustrate a flow chart for a programming operation.

The block lock check step 603 is described in more detail in FIG. 7. For one embodiment, each lock bit corresponds to a block of memory in the main array, and therefore, the lock check may be referred to as a block lock check. As previously mentioned, the flash memory device 200 includes a block lock mini-array 214 for storing bits referred to as the block lock bits. The setting and the clearing of the block lock bits is used to prevent or protect data stored in the main memory array 212 from being modified. For one embodiment, each block lock bit in the mini-array 214 corresponds to a respective block of memory cells in the main memory array 212. The programming (i.e., the setting or clearing) of the bits in the block lock mini-array 214 is described below in conjunction with FIG. 8.

According to step 701, the flash memory device 200 reads the block lock bit in the mini-array 214 that corresponds to the memory block in the main array 214 that includes the memory location selected (i.e., addressed) for a programming or erase operation. For one embodiment, the memory location addressed for a programming operation is a byte of data and the memory location addressed for an erase operation is a block of data. Step 701 typically occurs while the control logic is executing the command sequence for the programming operation or the erase operation.

While performing the block lock check, the control logic within the flash memory device 200 determines at step 702 whether the block lock bit is set. For one embodiment, a cleared lock bit is at a logic "0." A set lock bit is at a logic "1." If the corresponding block lock bit is set, then the control logic updates the status register 206 to indicate that the corresponding block lock bit is protected or locked. For one embodiment, memory location 402 is updated to indicate that the memory block selected for a data modification operation is locked.

On the other hand, if the corresponding block lock bit is not set, then the control logic updates the status register 206 to indicate that the corresponding block lock bit is not locked. For one embodiment, the memory location 402 is updated to indicate that the memory block selected for a data modification operation is unlocked.

FIG. 7 illustrates in step 702 that if the corresponding block lock bit is not set, then the block lock check is completed. For one embodiment, the DPS information in the status register 206 has already been initialized to indicate that the block lock bits are not set. Thus, when it is determined that the lock bit corresponding to the addressed memory location is not set, the DPS information does not need to be modified.

FIGS. 8 through 12 provide a detailed description of the programming operation for one embodiment of the flash memory device 200. Unlike the prior art flash memory devices, one embodiment may distinguish between a programming or write operation failure due to a device protect error and a program operation failure (such as a power failure or a bad block). Furthermore, unlike the prior art flash memory devices, one embodiment, allows the flash memory device 200 to suspend a programming operation.

For one embodiment, the main memory array 212 is programmed by performing a programming operation such as a byte write operation. In step 901, the control logic receives a programming command, such as a byte write command, to initiate the programming operation. Once the data to be written and the address to be written into the flash memory device 200 is received by the control logic in step 902, the status register 206 is updated to indicate that the control logic is busy performing a data modification operation in step 903. For one embodiment, the memory location 408 in the status register 400 is updated to store a logic "0."

Once the status register 206 has been updated at step 903, the control logic performs a block lock check at step 904. The block lock check in step 904 is performed in accordance with the steps described in FIG. 7. The block lock check ensures that the status register 206 includes the updated protection status information corresponding to the memory location selected for the programming operation. Next, in step 905, the control logic starts performing the programming operation specified by the programming command.

Figure 12:
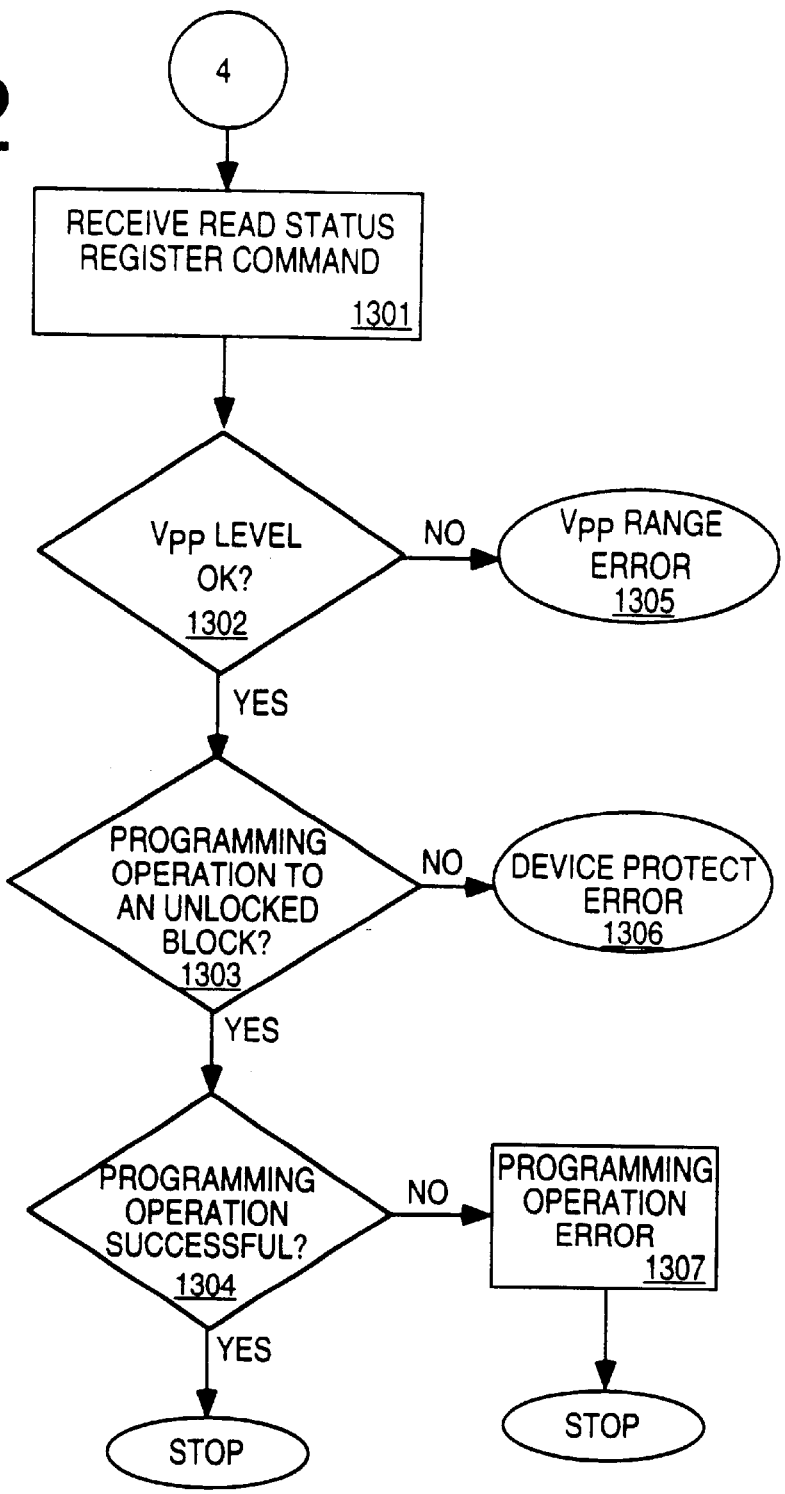
Figure 13:
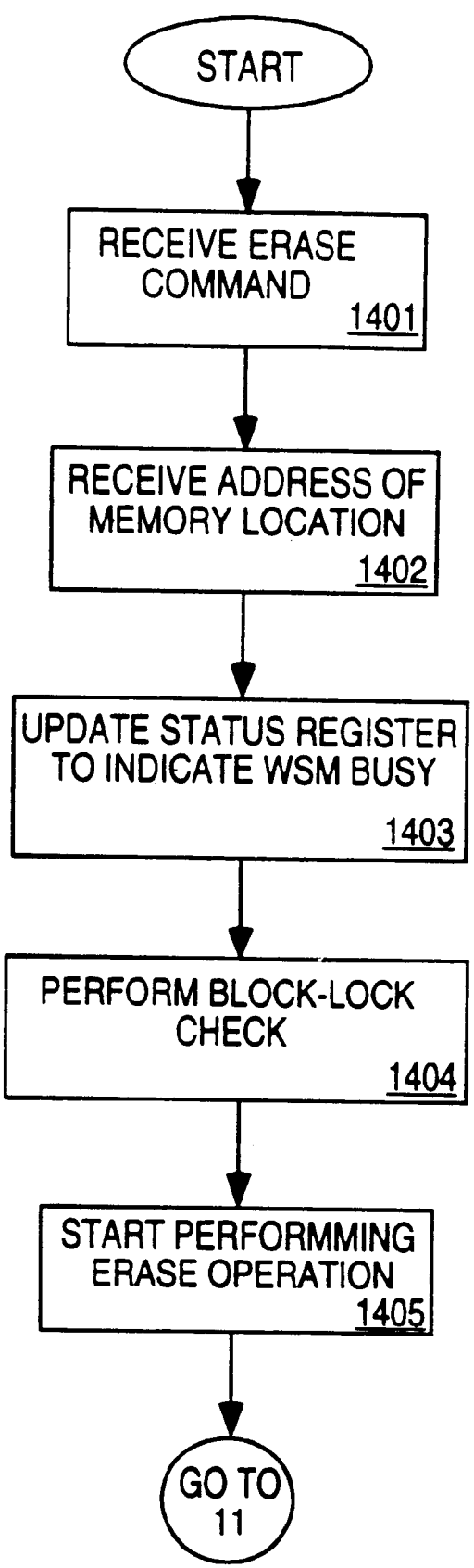
FIGS. 13 through 17 illustrate a flow chart for an erase operation.

The control logic then determines if the programming operation is completed in step 1001. If the programming operation is completed, then the status register 206 is updated to indicate that the control logic has completed its previous data modification operation and is ready to receive a new data modification operation in step 1002. After updating the status register 206, a determination is made in step 1003 whether to perform a full status check. The full status check checks the various status signals to determine whether a specified failure has occurred. FIG. 12 describes the status check in more detail. If a full status check is desired, then the control logic proceeds to step 1301. Otherwise, the programming operation is completed.

On the other hand, if the programming operation is not completed in step 1001, then the control logic determines whether a programming suspend command has been entered in step 1004. If a programming suspend command has been entered, then the control logic proceeds to step 1101 in FIG. 10.

Once a programming suspend command has been entered, the control logic may or may not proceed to suspend the programming operation. The programming suspend command requests that the control logic suspend the programming operation sequence at one of the predetermined points in the algorithm. Although a programming suspend command has been received by the control logic, if the program operation has already or is currently executing those commands, the programming operation may not be suspended.

If the programming operation is not suspended, the control logic returns to step 1001 to determine if the programming operation is completed. On the other hand, if the programming operation is suspended, the control logic proceeds to step 1102 to update the status register 206 to indicate that the programming operation is suspended. For one embodiment, the memory location 403 is updated to store a logic "1" to indicate the programming operation (e.g., byte-write operation) is suspended. Once the status register 206 is updated to indicate that the programming operation is suspended, the status register 206 is updated to indicate that the control logic is ready to perform a new data modification operation, as shown in step 1103. For one embodiment, the memory location 408 in the status register 206 stores WSMS information.

Once the status register 206 is updated, the control logic receives a read status register command as shown in step 1104. In response to the read status register command, the flash memory device 200 automatically outputs the WSMS signal and the BWSS signal. After the WSMS signal is outputted from the flash memory array 200, the flash memory array 200 receives a read command for a memory location other than that specified by the write operation that was suspended. In other words, a read operation may not be performed on the same memory location that was specified in the programming operation that is currently being suspended.

Figure 11:
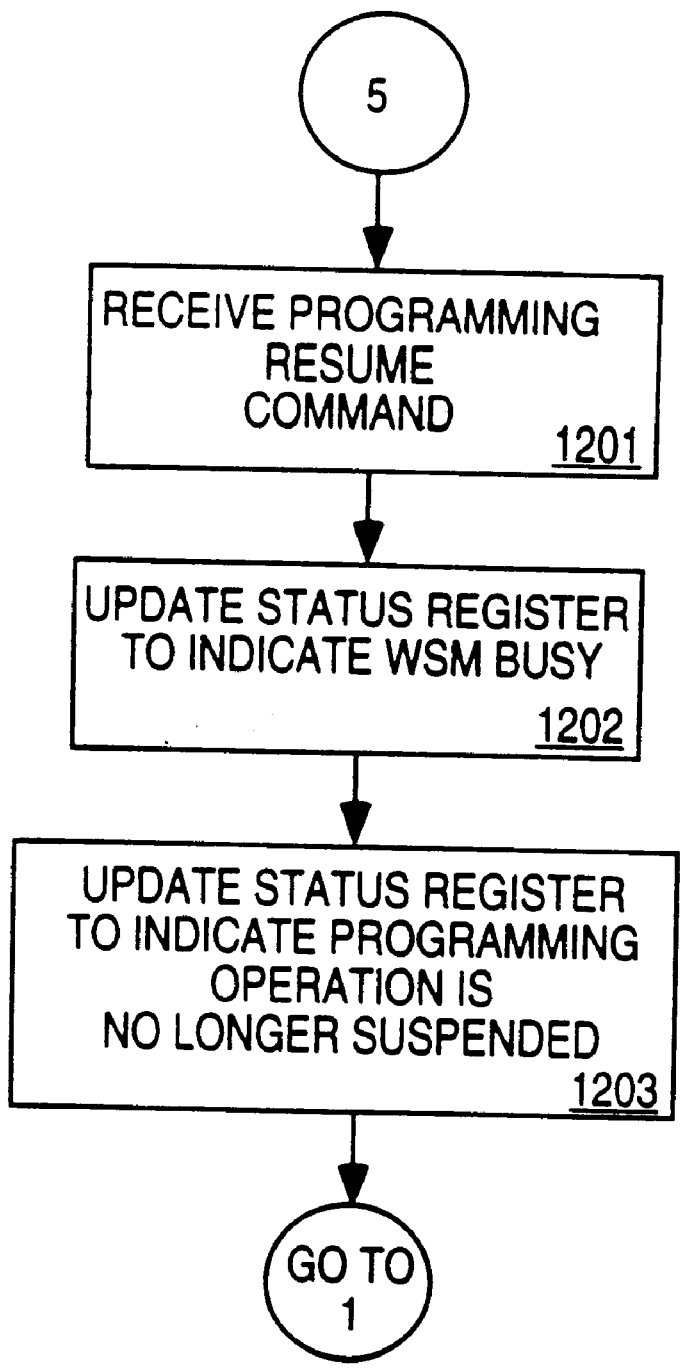

Next, a read operation is performed on the selected memory location in the main memory as shown in step 1106. The control logic determines when the read operation is completed in step 1107. Once the control logic has completed the read operation, the control logic proceeds to perform step 1201 as shown in FIG. 11.

Once the read operation is completed, the flash memory device 200 receives a programming resume command at step 1201. The control logic then updates the status register 206 to indicate that the control logic is busy completing the programming or write operation. Additionally, the status register 206 is updated at step 1203 to indicate that the programming operation is no longer suspended. For one embodiment, the memory location 408 and the memory location 403 in the status register 400 are each updated to store a logic "0." After steps 1202 and 1203 are completed, step 1001 is repeated.

Figure 9:
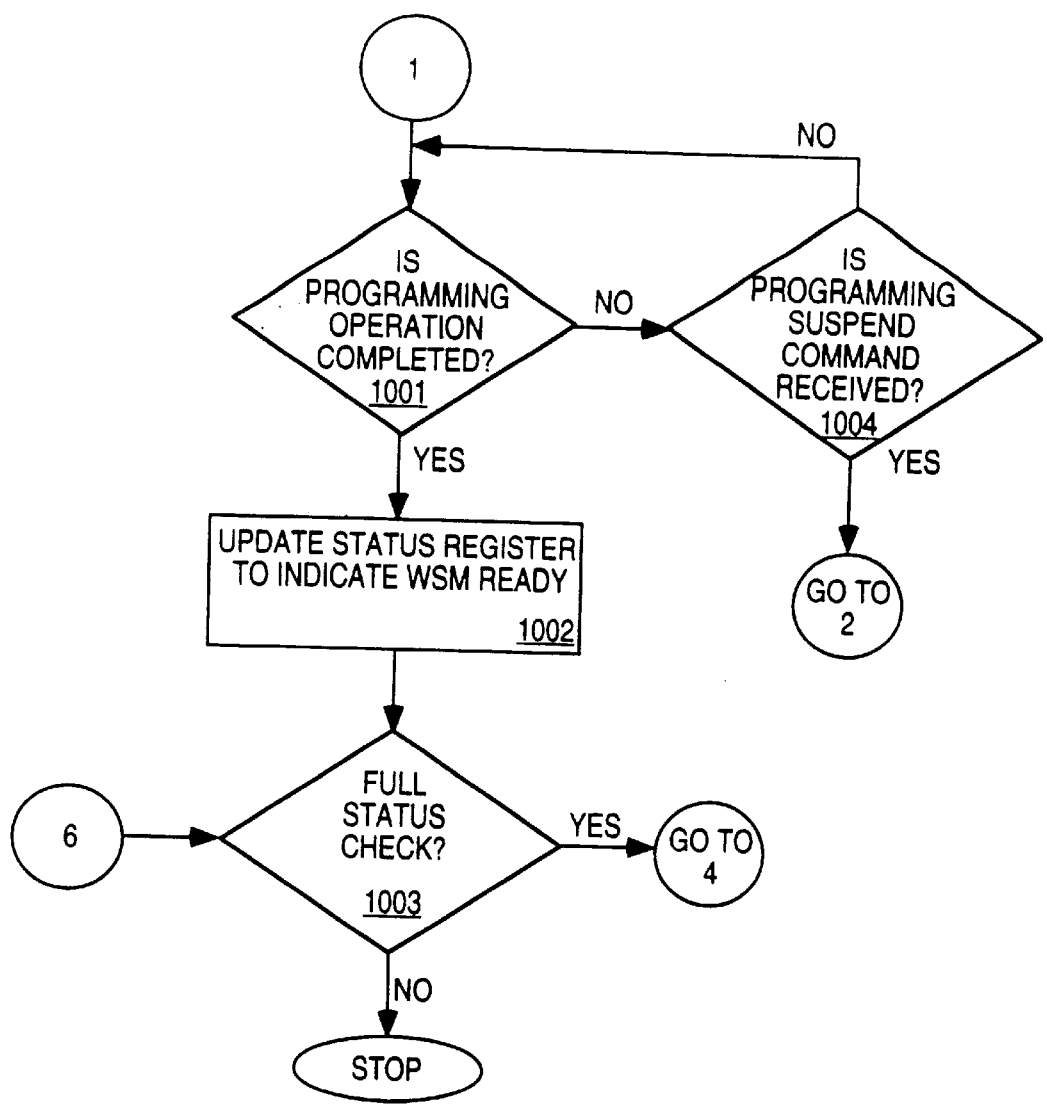
Figure 10:
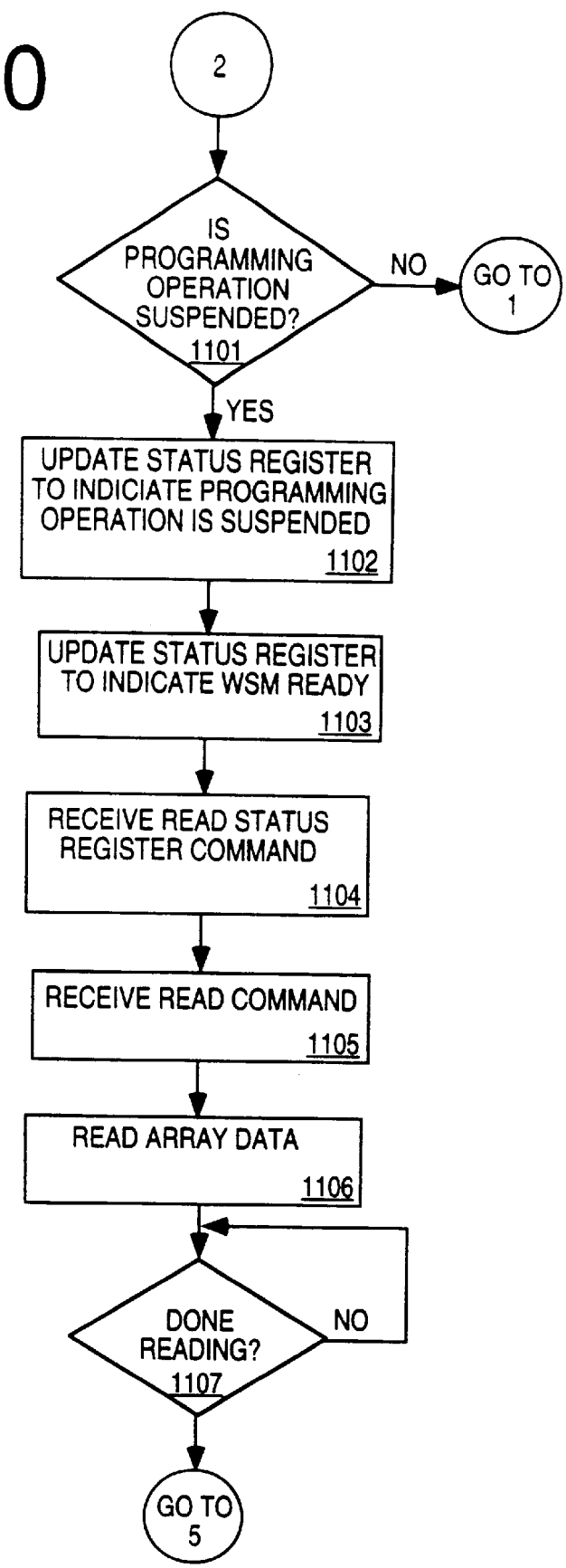

Referring back to step 1003 in FIG. 9, if the flash memory device 200 determines that a full status check is to be performed, the flash memory device 200 proceeds to step 1301 in FIG. 12. At step 1301, the control logic receives a read status register command. For one embodiment, the memory location 404 (which stores the VPPS information), the memory location 402 (which stores the DPS information), and the memory location 405 (which stores the BWSLBS information) may be read from the status register 206.

These memory locations within the status register 206 are read to determine the various failures modes. At step 1302, the flash memory device 200 checks whether the programming voltage Vpp applied to the flash memory device 200 is within the appropriate voltage level range. If Vpp is not within an appropriate voltage level (e.g., if Vpp is not greater or equal to 3 volts), then the VPPS signal indicates a Vpp range error in step 1305. On the other hand, if Vpp is within the appropriate range, then another status check is made.

The flash memory device 200 also checks whether the programming operation is requested to be performed on a memory location within a locked memory block in step 1303. If the selected memory location resides within a memory block that is device protected or locked, then a device protect error results, as shown in step 1306. On the other hand, if the selected memory location resides within an unprotected or unlocked memory block, then another status check is made.

At step 1304, the flash memory device 200 checks whether the programming operation was performed successfully. If the programming operation was not successfully completed, then the flash memory device 200 at step 1307 detects a program operation error in step 1307 and the code terminates. On the other hand, if the programming operation was successfully completed, then the full status check is completed. For an alternative embodiment, another status check may be made, however.

FIGS. 13 through 17 describe an erase operation for one embodiment. Unlike the prior art flash memory devices, one embodiment distinguishes between an erase operation failure due to a device protect error and a failure due to an erase operation failure (e.g., a bad memory location).

Once the flash memory device 200 receives an erase command (or command sequence) in step 1401 and the address of the memory location to be erased in step 1402, the status register 206 is updated at step 1403 to indicate that the control logic is busy performing an erase operation. For one embodiment, the memory location 408 in the status register 206 is updated to store a logic "0."

Next, the control logic performs a block lock check as shown in step 1404. For one embodiment, the block lock check is performed in accordance with the steps provided in FIG. 7. After the block lock check is completed, the control logic proceeds to start the erase operation.

Figure 14:
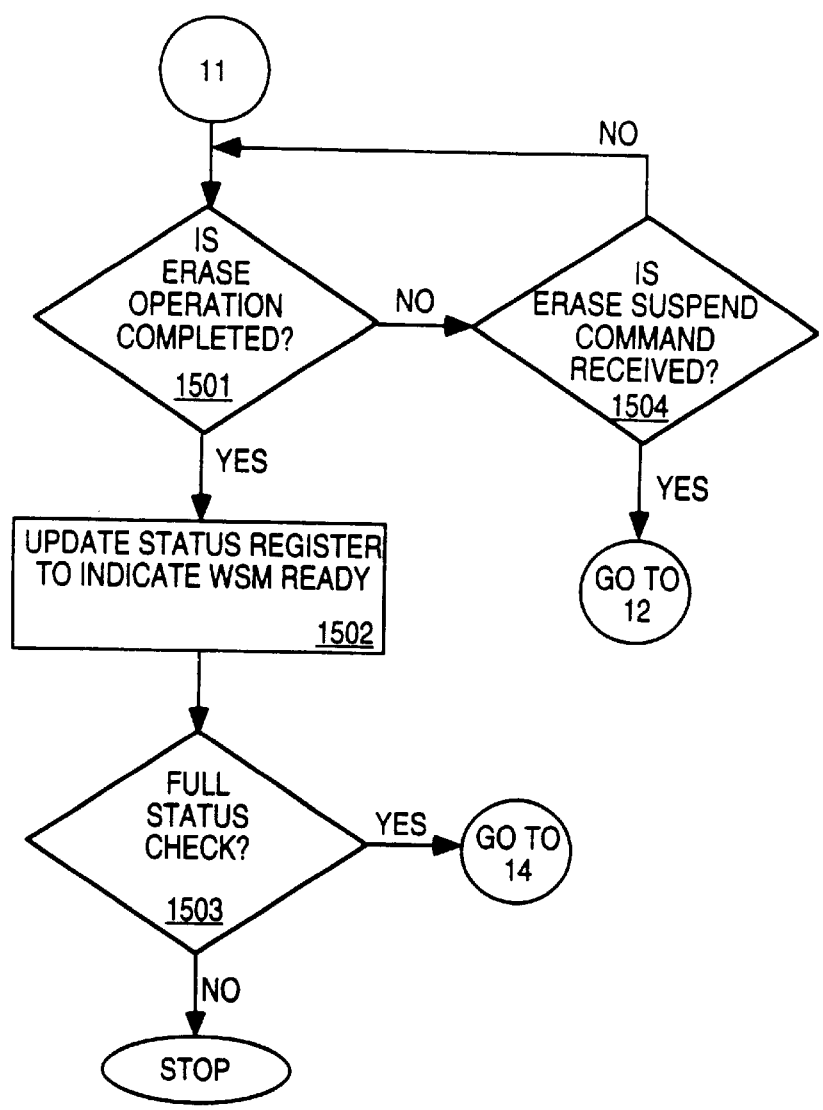
Figure 15:
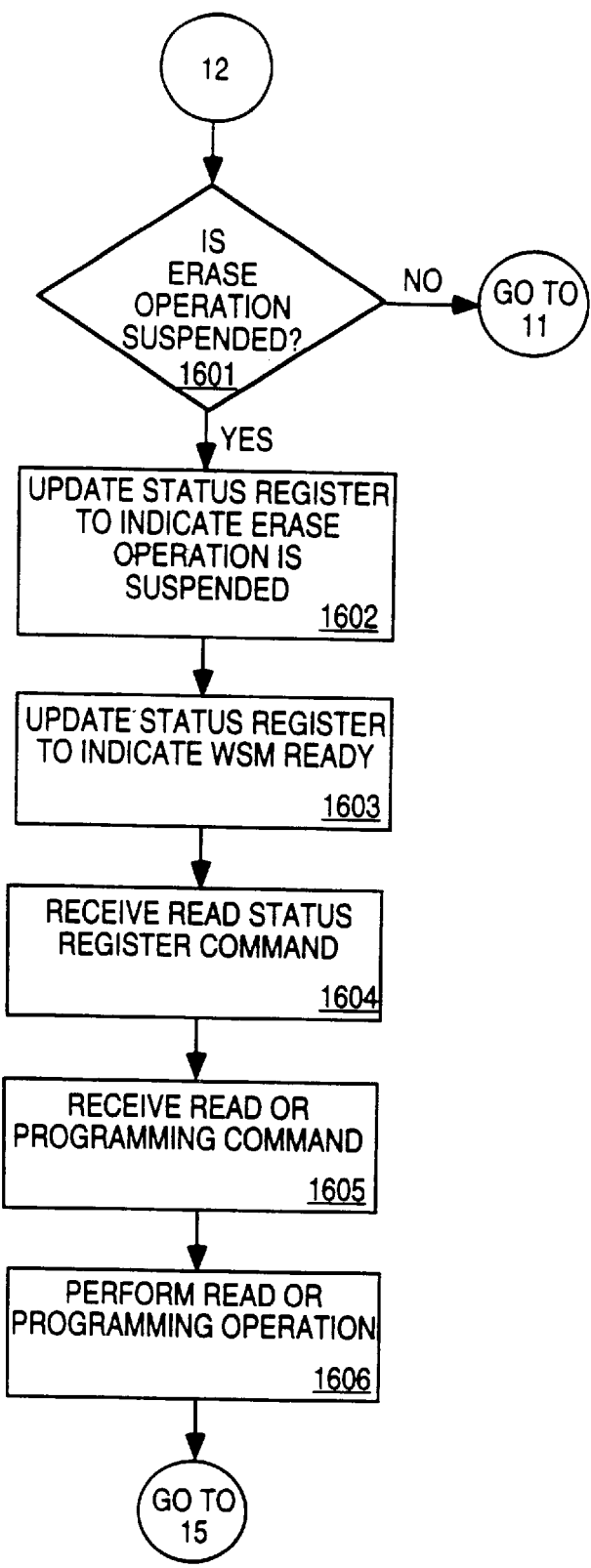

Next, step 1501 in FIG. 14 determines whether the erase operation is completed. If the erase operation is completed, then at step 1502 the status register 206 is updated to indicate that the control logic is ready to perform a new data modification operation. For one embodiment, memory location 408 is updated to store a logic "1." The flash memory device 200 then determines at step 1503 whether to perform a full status check. If a full status check is not performed, the erase operation is completed. Otherwise, the control logic proceeds to perform the full status check. For one embodiment, the full status check is performed according to the steps described in FIG. 17.

On the other hand, if it is determined at step 1501 that the erase operation is not completed, then the control logic determines whether the control logic has received an erase suspend command at step 1504. If an erase suspend command has not been entered, then step 1501 is repeated. Otherwise, the control logic proceeds to step 1601 in FIG. 15.

An erase operation is suspended at designated points in the erase operation algorithm. Once an erase suspend command has been received by the flash memory device 200, the control logic may or may not suspend the erase operation, depending on what stage the control logic is at in performing the erase operation. If the erase operation is not suspended, then step 1501 is repeated. Otherwise, the control logic updates the status register 206 to indicate that the erase operation is suspended, as shown in step 1602, and the control logic is ready to perform a new data modification operation, as shown in step 1603. For one embodiment, the memory location 407 in the status register 400 is updated to store a logic "1" and the memory location 408 in the status register is updated to store a logic "1."

At step 1604, the control logic receives a read status register command. Once the status register 206 indicates that the control logic is ready to perform a new data modification operation, the control logic receives a read or programming command, as shown in step 1603. Subsequently, the read operation or programming operation is performed in step 1606.

Figure 16:
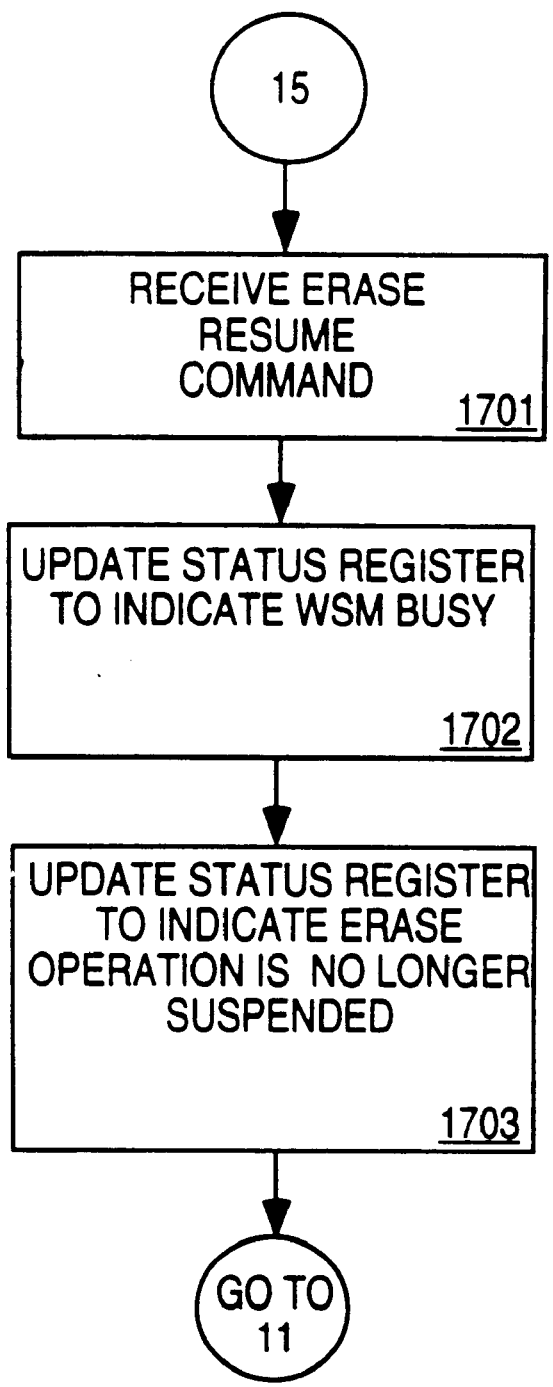

After the read or program operation is completed in step 1606, step 1701 is performed as, shown in FIG. 16. At step 1701, the control logic receives an erase resume command. Next, the status register 206 is updated to indicate that the control logic is busy performing the erase operation because the erase operation is no longer suspended. For one embodiment, the memory location 408 is updated to store a logic "0" and the memory location 407 is updated to store a logic "0." Step 1501 is then repeated.

Figure 17:
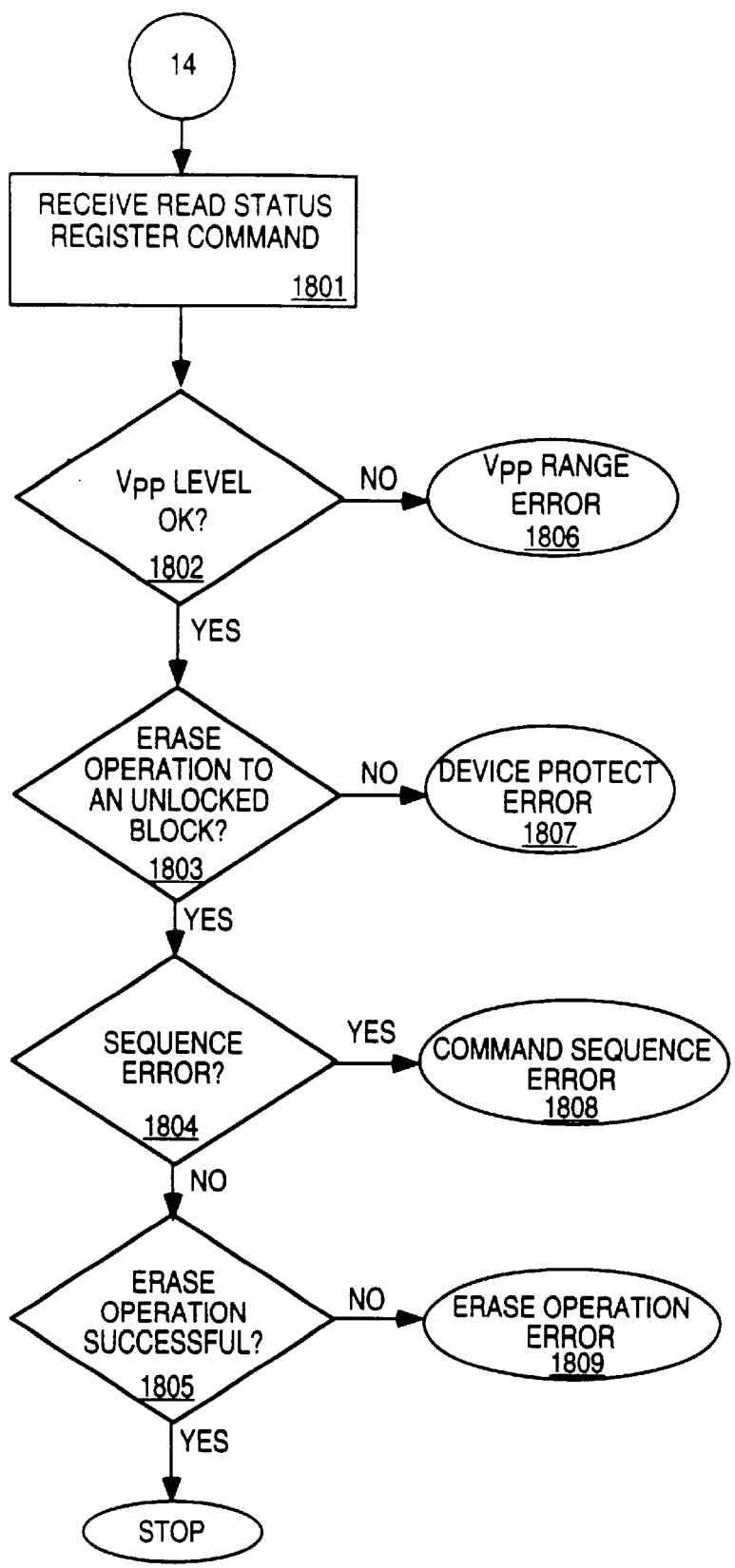

The steps in FIG. 17 are performed if it is determined in step 1503 that the a full status check is to be performed. The full status check in step 1503 is used to determine the various failure modes. The control logic receives the read status register command in step 1801. For one embodiment, memory location 404 (which stores the VPPS information), memory location 402 (which stores the DPS information), memory location 406 (which stores the ECLBS information), and memory location 405 (which stores the BWSLBS information), are read during the full status check.

A programming voltage Vpp range error is detected in step 1806 when the status register 206 indicates that the Vpp level is not in the appropriate range in step 1802. A device protect error 1807 is detected in step 1807 when the status register indicates that the attempted erase operation requested a protected or locked memory block to be modified, as shown in step 1803. A command sequence error is detected in step 1808 if at step 1804 both the memory locations 405 and 406 are found to be set to a logic "1." An erase operation error is detected in step 1809 when the status register indicates that the erase operation was not successfully completed. For one embodiment, the full status check is completed after performing the four status checks described above.

In the foregoing specification, the invention has been described with references to specific embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method comprising:

receiving a command to perform a data modification operation, the data modification operation pertaining to a memory location in a corresponding memory block;

determining if the corresponding memory block is protected such that the data modification operation cannot be performed;

initiating performance of the data modification operation if the corresponding memory block is not protected;

determining if the data modification operation failed; and if the data modification operation failed, indicating that the failure did not result from the memory location residing in a protected memory block.

2. The method of claim 1 wherein determining if the memory block is protected includes determining if one or more block lock bits corresponding to the memory block are set.

3. The method of claim 2 wherein the one or more block lock bits are stored in a block lock mini-array, the block lock mini-array storing a plurality of block lock bit sets containing the one or more block lock bits.

4. The method of claim 3 wherein each of the plurality of block lock bit sets corresponds to one of a plurality of memory blocks in a main memory array.

5. The method of claim 4 wherein each block lock bit set contains sixteen block lock bits and a master lock bit.

6. The method of claim 1 further comprising:

performing a status check to determine one or more failure modes.

7. The method of claim 6 wherein the one or more failure modes includes an inappropriate programming voltage.

8. The method of claim 6 wherein the one or more failure modes includes a defective memory block.

* * * * *

UNITED STATES PATENT AND TRADEMARK OFFICE
CERTIFICATE OF CORRECTION

PATENT NO. : 6,671,785 B2
DATED : December 30, 2003
INVENTOR(S) : Dalvi et al.

It is certified that error appears in the above-identified patent and that said Letters Patent is hereby corrected as shown below:

Column 1,
Line 9, insert -- The present invention relates to the field of semiconductor memories. More particularly, the present invention relates to providing a programming suspend status signal and a protection status signal for a nonvolatile memory. --.

Column 7,
Line 9, delete "OSM", insert -- CSM --.

Signed and Sealed this

Ninth Day of March, 2004

JON W. DUDAS
*Acting Director of the United States Patent and Trademark Office*